's Patent [19]

Liu

[11] Patent Number: 5,936,280
[45] Date of Patent: Aug. 10, 1999

[54] MULTILAYER QUADRUPLE GATE FIELD EFFECT TRANSISTOR STRUCTURE FOR USE IN INTEGRATED CIRCUIT DEVICES

[75] Inventor: Yowjuang William Liu, San Jose, Calif.

[73] Assignee: Advanced Micro Devices, Inc., Sunnyvale, Calif.

[21] Appl. No.: 08/837,557

[22] Filed: Apr. 21, 1997

[51] Int. Cl.[6] .................................................. H01L 27/01
[52] U.S. Cl. ........................ 257/347; 257/618; 257/777
[58] Field of Search .................................. 257/777, 618, 257/66, 57, 622, 623, 347

[56] References Cited

U.S. PATENT DOCUMENTS

| | | | |
|---|---|---|---|
| 4,996,574 | 2/1991 | Shirasaki . | |
| 5,120,666 | 6/1992 | Gotou | 438/164 |
| 5,202,754 | 4/1993 | Bertin et al. | 257/777 |
| 5,346,834 | 9/1994 | Hisamoto et al. . | |
| 5,420,048 | 5/1995 | Kondo . | |
| 5,451,798 | 9/1995 | Tsuda et al. . | |
| 5,481,133 | 1/1996 | Hsu | 257/777 |
| 5,482,877 | 1/1996 | Rhee . | |
| 5,497,019 | 3/1996 | Mayer et al. . | |
| 5,581,101 | 12/1996 | Ning et al. . | |
| 5,612,546 | 3/1997 | Choi et al. | 257/66 |
| 5,689,136 | 11/1997 | Usami et al. . | |

FOREIGN PATENT DOCUMENTS

| | | | |
|---|---|---|---|
| 3-288471 | 12/1991 | Japan . | |
| 4240762 | 8/1992 | Japan | 257/777 |

*Primary Examiner*—Olik Chaudhuri
*Assistant Examiner*—N. Kelly
*Attorney, Agent, or Firm*—Foley & Lardner

[57] ABSTRACT

A quadruple gate field effect transistor (FET) is provided on the semiconductor-on-insulator or semiconductor-on-insulator (SOI) structure or a bulk semiconductor structure. The silicon substrate is surrounded by a polysilicon material on at least three sides to form a gate. Additionally, the substrate can be surrounded by a fourth side to form a quadruple gate structure. The SOI structure can be comprised of two layers of SOI structures. Interlayer vias can be provided to connect each layer of the two-layer structure.

10 Claims, 5 Drawing Sheets

MULTILAYER QUADRUPLE GATE FIELD EFFECT TRANSISTOR STRUCTURE FOR USE IN INTEGRATED CIRCUIT DEVICES

FIELD OF THE INVENTION

The present invention relates to integrated circuit devices. More particularly, the present invention relates to a multilayer semiconductor-on-insulator integrated circuit structure.

BACKGROUND OF THE INVENTION

Semiconductor devices, such as, complementary metal oxide semiconductor (CMOS) integrated circuits, generally include field effect transistors (FETs) which are disposed in a single plane of a semiconductor substrate. Basically, semiconductor devices can be bulk semiconductor-type devices or semiconductor-on-insulator-type devices, such as, silicon-on-insulator (SOI) devices. Bulk semiconductor devices can include field effect transistors (FETs) which are manufactured as lateral or vertical devices disposed on a silicon substrate.

In bulk semiconductor-type devices which have lateral FETs, a top surface of the substrate is doped to form source and drain regions, and a gate conductor is provided on the top surface of the semiconductor substrate between the source and drain regions. In operation, an electric field is generated in a channel region between the source and drain regions (e.g., below the gate conductor) by an electric signal provided to the gate conductor. The electric field causes charge carriers to be conducted across the channel region along essentially the top surface of the semiconductor substrate. The electric field penetrates the channel region from one direction because the gate conductor is only located over the top surface of the channel region. The current density associated with the FET is somewhat limited because the current only travels near the top surface of the substrate (e.g., the current is one dimensional).

In bulk semiconductor-type devices which have vertical FETs, the semiconductor substrate, such as, a silicon substrate, is etched to form trenches or steps. The gate of the vertical transistor is disposed on a side wall of the trench or step. A channel region is located adjacent to the side wall. Due to its small lateral size, the vertical transistor generally allows more devices to be contained than a single semiconductor substrate. Similar to conventional lateral FETs discussed above, the gate conductors are disposed on only one side of the channel region, and the current density associated with the vertical FET is somewhat limited.

Bulk semiconductor-type devices can be subject to some disadvantageous properties, such as, less than ideal sub-threshold voltage slope during operation, high junction capacitance, and ineffective isolation. Additionally, bulk semiconductor-type devices often require epilayers, P-wells, or N-wells which require additional fabrication steps.

SOI (e.g., silicon-on-insulator) devices have significant advantages over bulk semiconductor-type devices, including near ideal subthreshold voltage slope, low junction capacitance, and effective isolation between devices. SOI-type devices generally completely surround a silicon or other semiconductor substrate with an insulator. Devices, such as, FETs or other transistors, are disposed on the silicon by doping source and drain regions and by providing gate conductors between the source and drain regions. SOI devices provide significant advantages, including reduced chip size or increased chip density, because minimal device separation is needed due to the surrounding insulating layers. Additionally, SOI devices can operate at increased speeds due to reductions in parasitic capacitance.

Similar to conventional bulk semiconductor-type devices discussed above, conventional SOI devices have somewhat limited current density because the gate conductor is provided only on one side of the channel region. Additionally, conventional SOI devices generally have a floating substrate (the substrate is often totally isolated by insulating layers). Accordingly, SOI devices are subject to floating substrate effects, including current and voltage kinks, thermal degradation, and large threshold voltage variations.

SOI devices also can have some limited packing densities because they are limited in vertical integration. Generally, SOI devices are only comprised of a single SOI layer.

Thus, there is a need for an SOI device which has improved density and improved vertical integration. Further, there is a need for an SOI device which includes an FET which has improved density, increased operating speed, and higher current density. Further still, there is a need for a multilayer SOI device.

SUMMARY OF THE INVENTION

The present invention relates to an integrated circuit that includes a first layer and a second layer. The first layer includes a first semiconductor substrate containing a first channel region of at least one first field effect transistor. The first semiconductor substrate is disposed between a first insulating layer and a second insulating layer, whereby the second insulating layer is coupled to a support substrate. The second layer includes a second semiconductor substrate containing a second channel region of at least one second field effect transistor. The second semiconductor substrate is disposed between a third insulating layer and a fourth insulating layer. The fourth insulating layer is in contact with the first insulating layer, whereby the first semiconductor substrate is stacked below the second semiconductor substrate.

The present invention further relates to a multilayer structure for containing a plurality of transistors. The multilayer silicon-on-insulator structure includes a first layer and a second layer. The first layer includes a first semiconductor substrate containing a first channel region of at least one first field effect transistor. The first semiconductor substrate is at least partially surrounded by insulating material. The second layer includes a second semiconductor substrate that is at least partially surrounding by insulating material. The first semiconductor substrate is stacked below the second semiconductor substrate, and the first layer is bonded to the second layer.

The present invention still further relates to a method of making a multilayer silicon-on-insulator structure for containing a plurality of transistors. The method includes providing a first layer, including a first semiconductor substrate and a first conductive layer; providing a second layer, including a second semiconductor substrate and a second conductive layer; and attaching the first layer to the second layer. The first conductive layer is adjacent to the first semiconductor substrate, whereby the first semiconductor substrate is at least partially surrounded by insulating material. The first conductive layer is electrically coupled to a first via. The second conductive layer is adjacent to the second semiconductor substrate, whereby the second semiconductor substrate is at least partially surrounded by insulating material. The second conductive layer is electrically coupled to a second via. The first layer is attached to the second layer such that the first via is electrically coupled to the second via.

In one aspect of the present invention, a SOI FET device has near ideal subthreshold voltage slope, low junction capacitance, an effective isolation as well as increased current density. The FET can have a non-floating (e.g., a biased) substrate to reduce floating substrate effects, such as, current and voltage kinks, thermal degradation, and large voltage variations. The substrate is rectangular or bar-shaped.

In another aspect of the present invention, a quadruple gate FET structure provides wider channel conduction for higher drive current. The quadruple gate construction provides three dimensional current within the channel region of the substrate on an SOI-type or bulk-type device. The current is driven in a rectangular cross section and is not limited to the top surface of the substrate. The surrounded gate structure improves current drive characteristics of the FET, provides a more uniform electric field in the channel region, and reduces hot carrier injection reliability limitations.

In accordance with still another aspect of the present invention, epilayers, N-wells, and P-wells are not required, thereby making the device easier to manufacture. Requirements for special polydoping and boron penetration are also not necessary. Preferably, the method of making a quadruple gate device is compatible with conventional bulk silicon and SOI fabrication processes. Also, SOI devices often have a leakage path at the bottom (e.g., opposite the gate) silicon and insulator interface.

In accordance with a further aspect of the present invention, a method of stacking quadruple gate FET structures increases packing density by allowing essentially unlimited vertical integrations. A first SOI or bulk-type layer can be stacked and bonded to a second SOI or bulk-type layer. The layers are coupled by interlayer vias which extend into both layers.

BRIEF DESCRIPTION OF THE DRAWINGS

Preferred embodiments of the invention will hereinafter be described in conjunction with the appended drawings wherein like numerals denote like elements.

DETAILED DESCRIPTION OF THE PREFERRED EMBODIMENTS

Figure 1:
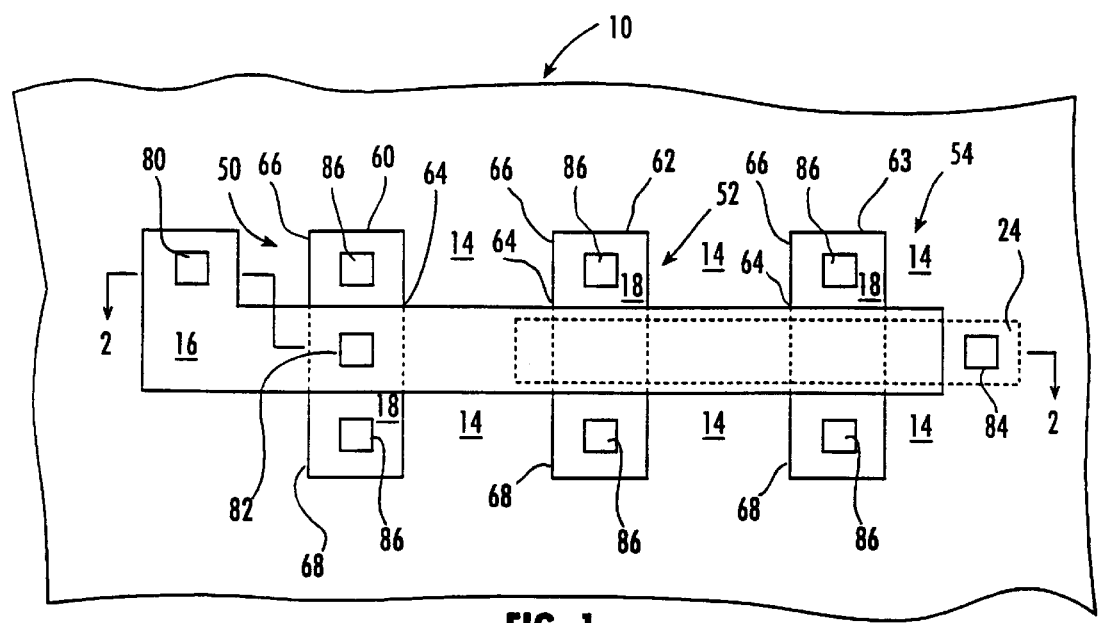
FIG. 1 is a bottom view of an integrated circuit in accordance with an exemplary embodiment of the present invention.
Figure 2:
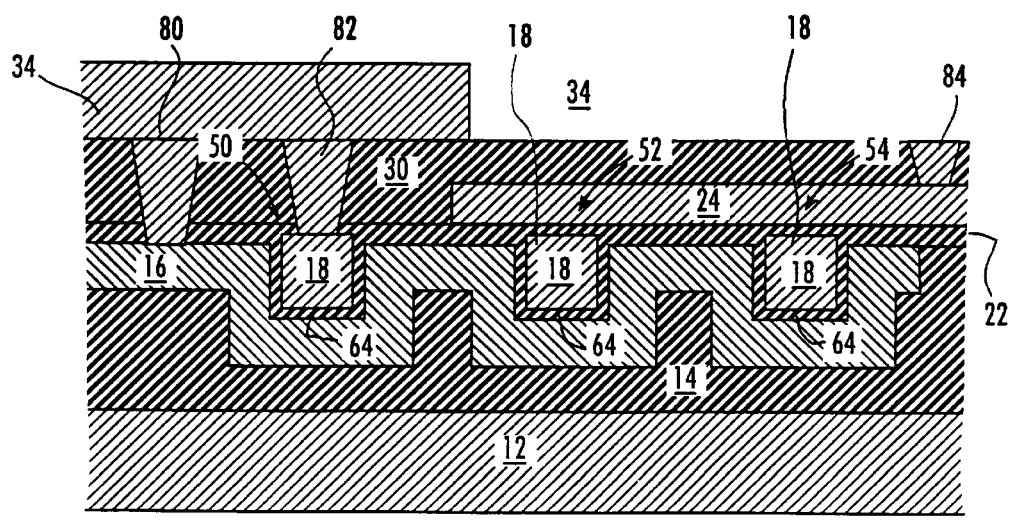
FIG. 2 is a cross-sectional view of the integrated circuit illustrated in FIG. 1 about lines 2—2.

With reference to FIGS. 1 and 2, a first semiconductor-on-insulator (SOI), such as, a silicon-on-insulator integrated circuit 10, includes a support substrate 12, a base insulating layer 14, a conducting layer 16, a silicon substrate 18, an insulating layer 22, a conducting layer 24, an insulating layer 30, and a partial metal layer 34. FIG. 1 shows a bottom view of circuit 10 from just below layer 16. Alternaktively, layer 10 can include all bulk semiconductor devices.

Support substrate 12 can be a semiconductor material, an insulating material, or other substance that provides a base for integrated circuit 10. Support substrate 12 can be silicon dioxide, silicon, or a flexible material. Support substrate 12 is attached to insulating layer 14 by an adhesive or by other bonding material, and substrate 12 is preferably a flexible material (e.g., fiberglass).

Insulating layers 14 and 30 can be any dielectric or insulating material. Preferably, layers 14 and 30 are a deposited high-temperature oxide, such as, TEOS-based oxide, silicon dioxide, spin-on-glass (SOG), PECVDTEOS oxide, SiH-based, PECVD oxide, or a two-layer glass and nitrite material. Conducting layer 16 and 24 are preferably doped polysilicon or polycide layers. Alternatively, layers 16 and 24 can be any conducting material, such as, titanium, amorphous silicon, metal, tungsten, or other conductor. Layers 16 and 24 can be deposited by dipping, evaporation, collimated sputtering, physical vapor deposition, sputter deposition, chemical vapor deposition (CVD), or other deposition techniques. Furthermore, layers 16 and 24 can also be a sandwich structure that includes polycide and polysilicon layers to reduce resistivity.

As shown in FIGS. 1 and 2, in an exemplary fashion only, integrated circuit 10 includes a transistor 50, a transistor 52, and a transistor 54. Transistors 50, 52, and 54 are preferably field effect transistors (FETs). Transistor 50 is provided on a bar-shaped semiconductor portion 60 of substrate 18. Transistor 52 is provided on a bar-shaped portion 62 of semiconductor substrate 18. Transistor 54 is provided on a bar-shaped portion 63 of semiconductor substrate 18. Substrate 18 is preferably silicon and is divided into discrete rectangular prisms or bar-shaped portions 60, 62, and 63, although although cylindrical or other geometries for these portions of substrate 18 are possible.

Each of transistors 50, 52, and 54 is comprised of a gate region 64, a source region 66, and a drain region 68. Gate region 64 is provided between region 66 and 68 and represents a channel region for transistors 50, 52, and 54. Regions 66 and 68 are preferably doped semiconductor regions provided in substrate 18. Transistors 50, 52, and 54 can be a N-channel, a P-channel, or other type of transistor.

Portion 60, 62, and 63 of substrate 18 are advantageously isolated from each other by insulating layers 14 and 22. The isolation associated with layers 14 and 22 enables transistors 50, 52, and 54 to have low junction capacitance relative to conventional bulk-type semiconductor devices.

Gate 64 of each of transistors 50, 52, and 54 is advantageously formed by conducting layer 16. Conducting layer 16 as provided on at least three sides of a middle section of portions 60, 62, and 63. Layer 16 is also provided over insulating layer 22, which is preferably a thermally grown oxide. Layer 22 is provided on all four sides of the portions 60, 62, and 63 and operates as a gate oxide. Thus, layer 16 essentially surrounds portions 60, 62 and 63 and, thereby, is able to provide an electric field in three dimensions into the channel regions of transistors 50, 52, and 54 (portions 60, 62, and 63, respectively).

A conductive layer 34 can be connected to conducting layer 16 by a via 80. Vias 86 can be coupled to each source region 66 and drain region 68 associated with transistors 50, 52, and 54. Vias 86 are coupled to opposite ends of portions 60, 62, and 63. Layer 34 is preferably silicide. Alternatively, layer 34 can be metal, aluminum, gold, polysilicon, or other conductive material.

Layer 16 is preferably L-shaped to provide more area for the placement of via 80 away from gate region 64. Alternatively, layer 16 can be straight, rectagular or T-shaped.

Layer 34 can also provide a substrate bias signal to the channel region of transistor 50. A via 82 (e.g., isolated from via 80) couples layer 34 to substrate 18 of transistor 50 (e.g., portion 60). Substrate 18 associated with transistor 50 is, thus, biased through via 82. Therefore, floating substrate effects can be reduced with respect to transistor 50 because substrate 18 is not a floating substrate (e.g, bulk-type device). A via (not shown) similar to via 82 can also be coupled to portion 62 and 63 (preferably isolated from layer 24) to provide a biased signal to the channel region of transistors 52 and 54, respectively. Integrated circuit 10 provides significant advantages, including most of the advantages associated with integrated circuits manufactured from SOI techniques, and yet eliminates floating substrate problems by the use of via 82 associated with transistor 50.

Transistors 52 and 54 include portions 62 and 63 which are surrounded on all four sides by the combination of conducting layers 16 and 24. The combination of conducting layers 16 and 24 thus, provides a quadruple gate structure that supplies an electric field on all four sides of portions 62 and 63. Layer 24 is coupled to layer 34 or other conductive layers through via 84 (the actual connection is not shown in FIGS. 1–7). Moreover, the quadruple gate structure associated with transistors 52 and 54 provides a more uniformed channel field distribution, thereby minimizing or eliminating hot carrier injection problems associated with the conventional FETs.

Surrounding portions 60, 62, and 63 by layer 16 provides a three dimensional wide channel conduction for high gain for each of transistors 50, 52, and 54. Providing layer 24 yields even more uniform channel field distribution because each side of portions 60, 62, and 63 is surrounded by a gate conductor. Special polydoping is not needed for minimization of short channel effects because the quadruple gate structure can more precisely control off-state leakage. Additionally, layers 16 and 24 can be biased separately to optimize performance of transistors 52 and 54 for high drive current and to minimize off-state leakage. For example, layer 24 can be reversed biased to pinch off leakage paths.

Layer 24 can advantageously reduce the leakage path associated with the bottom silicide and insulator interface in the conventional SOI device. Integrated circuit 10 illustrated in FIG. 2 has a denser layout because there is direct access to substrate 18 and the gate through the top of circuit 10. Additionally, circuit 10 is fully planarized (on both sides) by planarization techniques such as a chemical mechanical planarization process. The fully planarized structure allows for greater integration and multiple level SOI devices.

Figure 7:
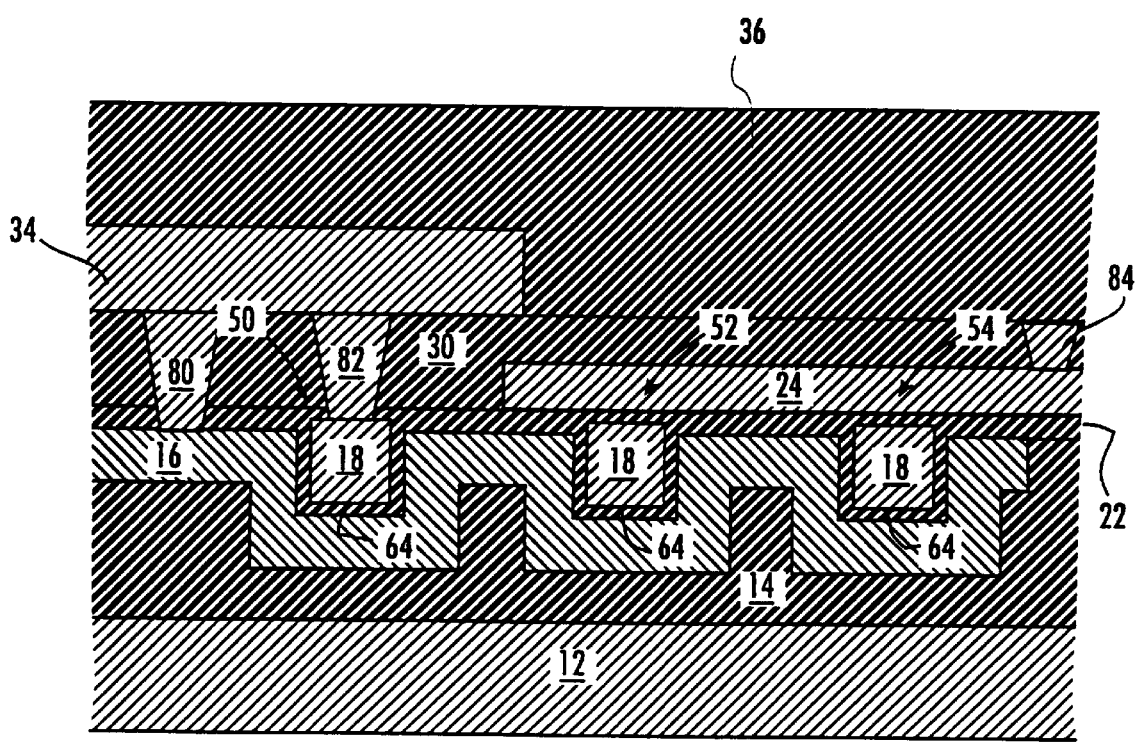
FIG. 7 is a cross-sectional view of the integrated circuit illustrated in FIG. 2 after the top insulating layer is provided.

With reference to FIG. 7, first semiconductor-on-insulator integrated circuit 10 further includes a top insulating layer 36. Top insulating layer 36 is disposed over layer 34 and over any exposed surface of insulating layer 30. Although it can be any dielectric or insulating material, top insulating layer 36 is preferably a deposited high-temperature oxide similar to insulating layers 14 and 30.

Figure 8:
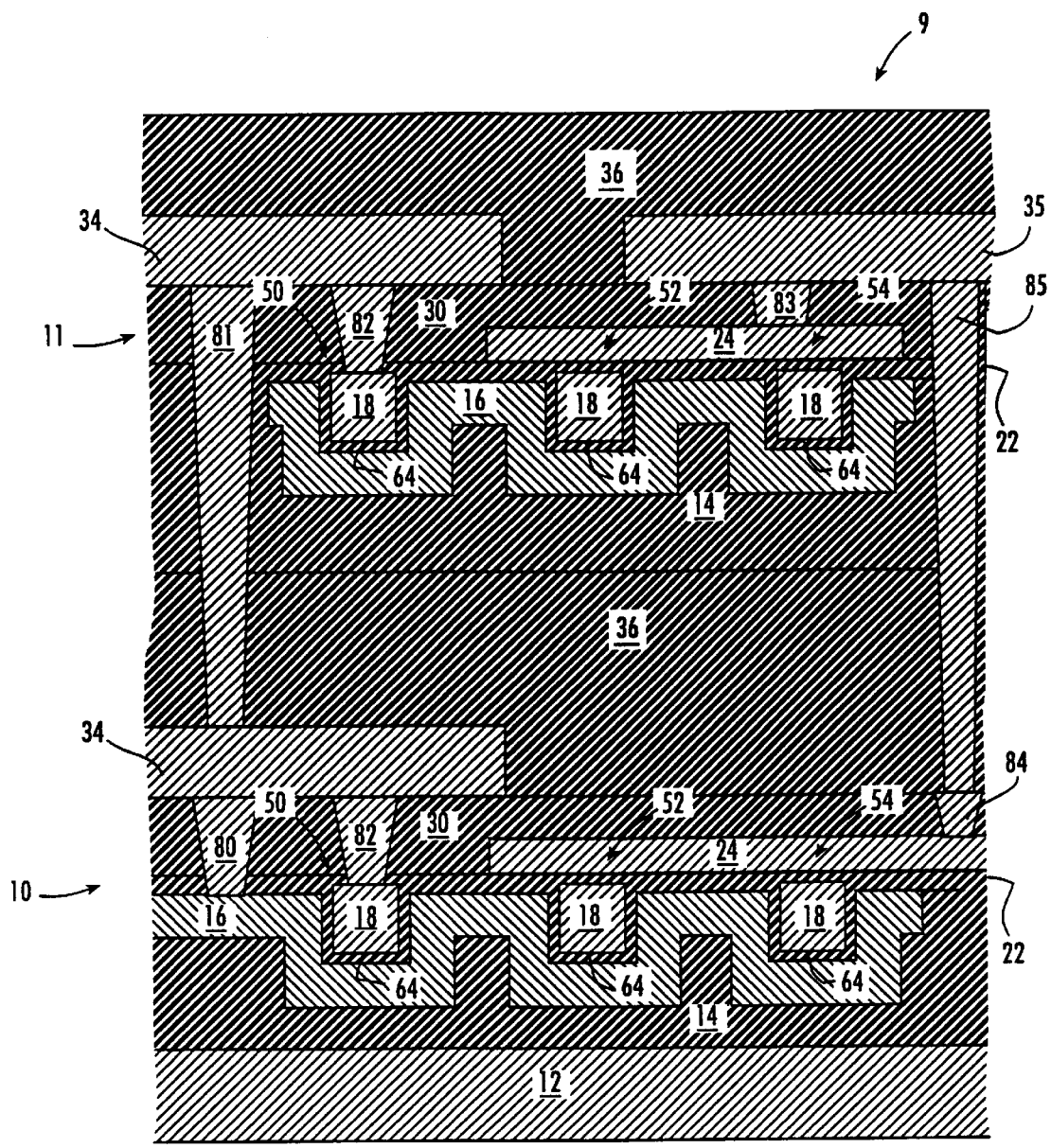
FIG. 8 is a cross-sectional view of the integrated circuit illustrated in FIG. 7 when stacked below a second similarly manufactured integrated circuit.

With reference to FIG. 8, a multilayer SOI integrated circuit 9 includes first SOI integrated circuit 10 and a second SOI integrated circuit 11. Circuit 10 is a first layer, and circuit 11 is a second layer for circuit 9. Circuit 10 (FIGS. 1–7) is stacked below second SOI integrated circuit 11. Alternatively, layers 10 and 11 can be bulk-type semiconductor devices.

Second SOI circuit 11 is preferably similar to first SOI circuit 10 both in composition and in structure. Alternatively, layer 10 can have different types of circuitry and different substrates, and can include different devices than layer 11. However, second integrated circuit 11 further includes an interlayer via 81 (instead of a via 80), a second partial conductive layer 35, a via 83, and an interlayer via 85 (instead of a via 84). Furthermore, there is no support substrate 12 intervening between circuits 10 and 11.

Both partial conductive layers 34 and 35 in the second SOI circuit 11 are disposed over insulating layer 30. Partial conductive layer 34 is coupled to interlayer via 81 and to via 82. Interlayer via 81 couples conductive layer 34 of the second circuit 11 to layer 34 of the first circuit 10. Additionally, partial conductive layer 35 is coupled to via 83 which is coupled to conductive layer 24 of circuit 11. Layer 35 is further coupled to interlayer via 85, which vertically extends to couple to conductive layer 24 through via 84 of circuit 10. Just as in the exemplary embodiment of first SOI integrated circuit 10, top insulating layer 36 of second integrated circuit 11 is disposed over conductive layers 34 and 35 and over any exposed surface of insulating layer 30. A metal layer (not shown) can be provided over layer 36. The metal layer can provide various interconnections for structures on circuits 10 and 11.

Figure 3:
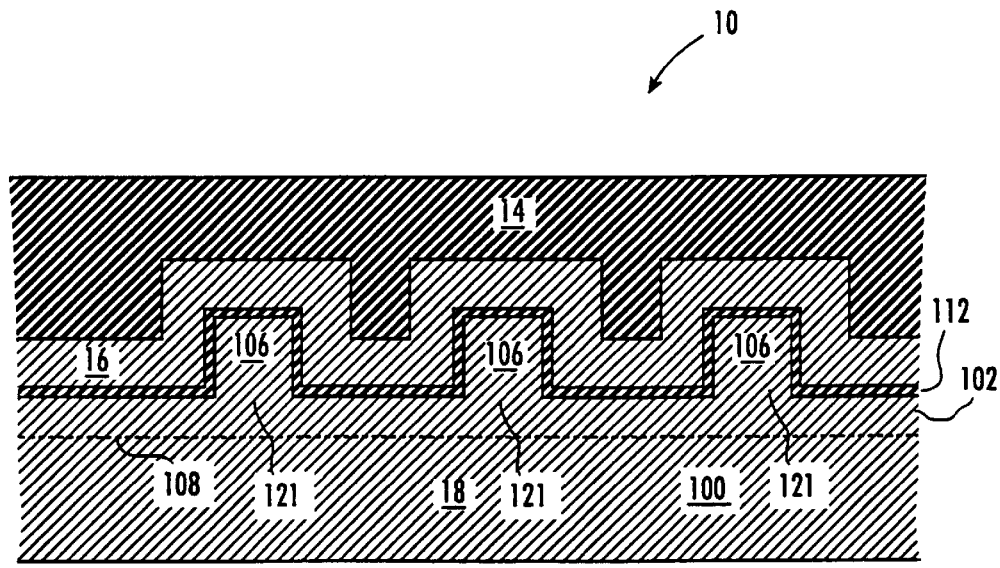
FIG. 3 is a cross-sectional view of the integrated circuit illustrated in FIG. 2 before the substrate is etched and before source and during contacts are provided.

The manufacture of integrated circuit 10 is discussed with reference to FIGS. 1–6 below. In FIG. 3, substrate 18, which is preferably silicon, includes a heavily doped region 100 and a lightly doped region 102. However, in FIG. 3, integrated circuit 10 is shown without layer 34, layer 24, vias 80 and 82, and in an upside orientation relative to FIGS. 1, 2, and 4–6. Stepped structures 106 are formed above a boundary line 108 between lightly doped region 102 and heavily doped region 100. Substrate 18 is preferably etched or otherwise shaped to form stepped structures 106. Structures 106 have two side walls, a top, and a bottom. Substrate 18 can be etched by reactive ion etching (RIE), directional dry etching, planarization, or other removal techniques.

After stepped structures 106 are formed, a thin gate oxide layer 112 is thermally grown on the exposed surfaces of structures 106. Layer 112 becomes a part of layer 22, as described below with reference to FIG. 6. Layer 112 is preferably silicon dioxide. Layer 16 is preferably 1,000 to 5,000 Angstroms (A) thick and is deposited by CVD as a conformal layer on structures 106. Stepped structures 106 can be any dimensions according to application parameters and preferably a vertical height of 0.1 microns from bottom surface 121 to layer 112 and a width of 0.1 microns.

Conducting layer 16 is deposited over layer 112. Insulating layer 14 is deposited over layer 16. Layer 14 can be 0.5 to 2 microns thick and completely covers layer 16. Layer 14 is preferably polished back to form a smooth surface. The thickness of layer 14 can affect the heat conductivity and coupling capacitance associated with circuit 10.

Figure 4:
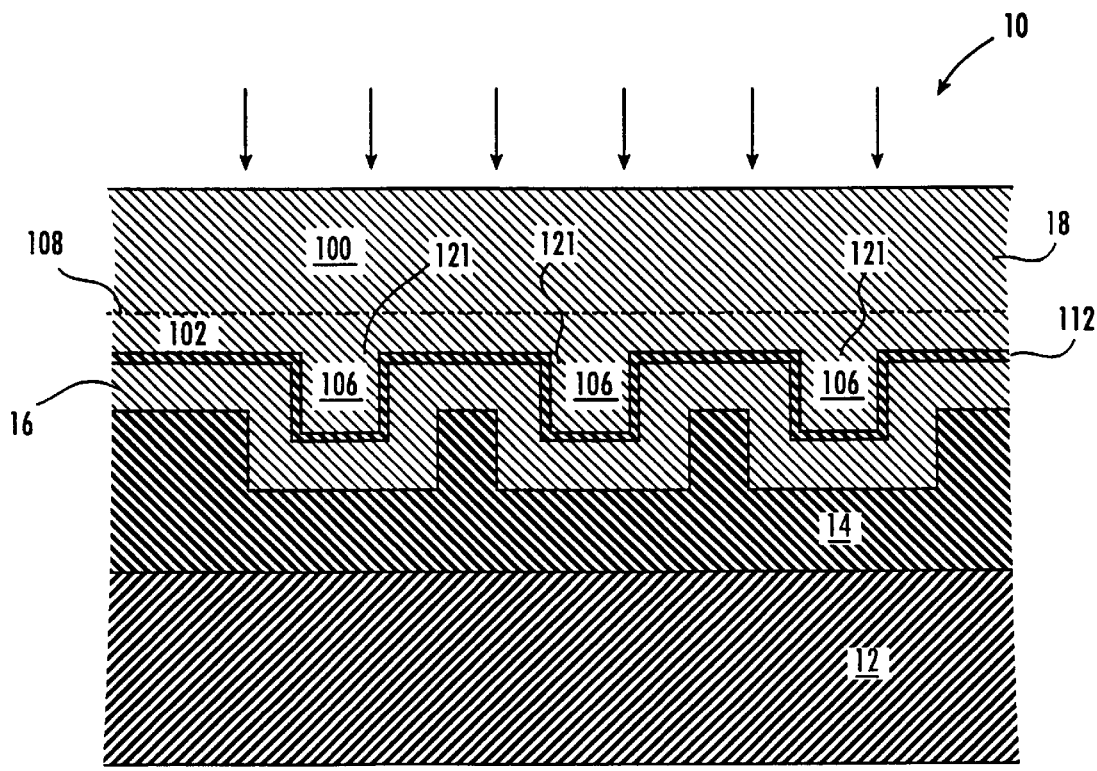
FIG. 4 is a cross-sectional view of the integrated circuit illustrated in FIG. 3 when the substrate is being edged.

Integrated circuit 10 is flipped over from its orientation in FIG. 3 and etched, as shown in FIG. 4. Before etching substrate 18, layer 14 is preferably bonded to support substrate 12. Substrate 18 of integrated circuit 10 is polished to remove heavily doped region 100 to boundary line 108. Boundary line 108 provides an etch stop area for chemical, mechanical polishing of substrate 18. Once lightly doped region 102 is reached, substrate 18 is preferably further etched by reactive ion etching until a bottom surface 121 of stepped structures 106 is reached.

Figure 5:
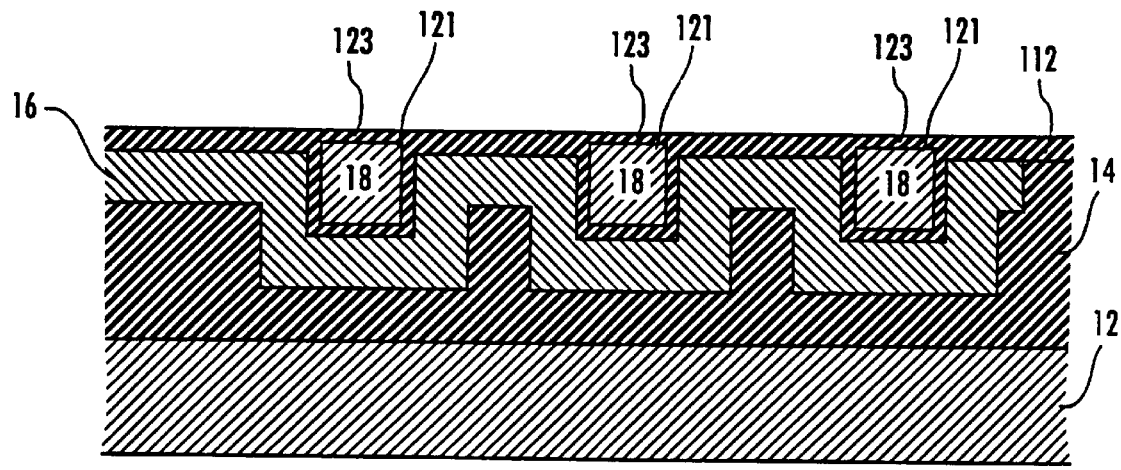
FIG. 5 is a cross-sectional view of the integrated circuit illustrated in FIG. 3 after the substrate is etched and before the second gate conductor layer is provided.
Figure 6:
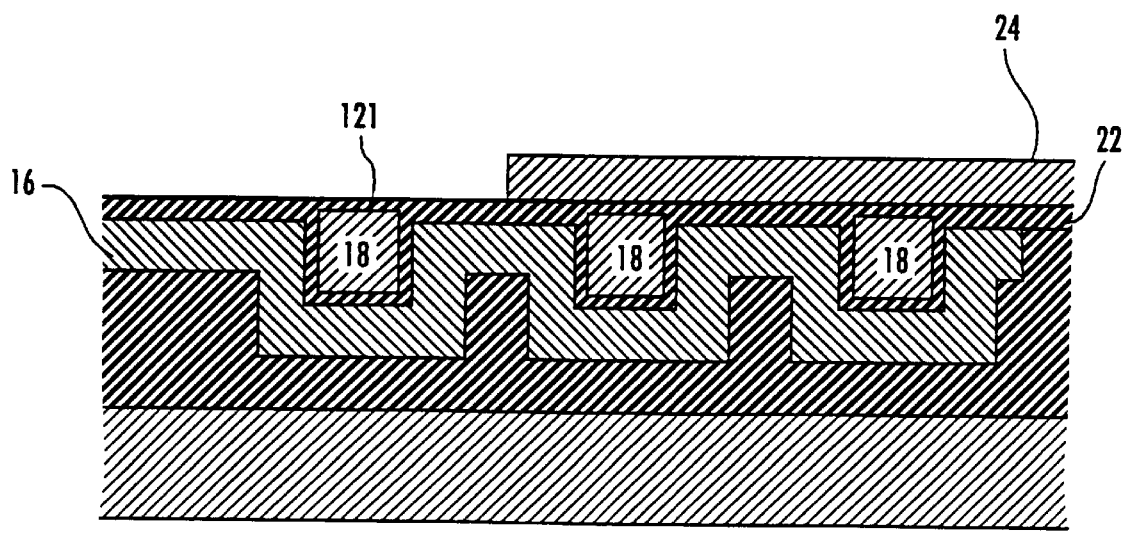
FIG. 6 is a cross-sectional view of the integrated circuit illustrated in FIG. 5 after the second gate conductor layer is provided.

With reference to FIG. 5, bottom surface 121 of stepped structures 106 is oxidized to form a layer 123. Layers 112 and 123 combine to form layer 22 (FIGS. 2 and 6). Due to the compositional differences in structures 106 (e.g., silicon) and in layer 16 (e.g., polysilicon), layer 123 grows at different rates on surface 121 than on layer 16. Preferably, layer 123 is thicker over layer 16 than over surface 121. After layer 123 is thermally grown, thereby forming layer 22 with layer 112, layer 24 is deposited over layer 22 (FIG. 6).

Layer 24 is preferably a layer similar to layer 16 in material and in dimension. Layer 22 is preferably 50Å thick around portions 60, 62, and 63. Layer 22 can be a different thickness between layer 16 and substrate 18 than between layer 24 and substrate 18. In this way, performance of circuit 10 can be optimized for particular applications.

With reference to FIG. 7, layer 30 is deposited on top of layers 24 and 22. Layer 30 is 0.5 to 2 microns thick and can be etched to provide holes for conductive vias 80, 82, 84, and 86. After selectively etching layer 30, the holes are filled with a conductive material to form vias 80, 82, 84, and 86. Vias 80, 82, 84, and 86 can be aluminum, tungsten, polysilicon, or other conductive material. After vias 80, 82, 84, and 86 are formed, partial metal layer 34 is deposited and subsequently etched to form appropriate connections for integrated circuit 10. Finally, top insulating layer 36 of circuit 10 is deposited over partial metal layer 34 and over any exposed surface of layer 30, as shown in FIG. 7. Top insulating layer 36 can be etched to provide holes for interconductive vias when circuits are stacked.

The manufacture of second SOI integrated circuit 11 is preferably similar to the manufacture of first SOI circuit 10 both in composition and in dimensions, as just described above. The additional steps required to make the interconnections between the stacked circuits are discussed with reference to FIG. 8. Just as with first SOI circuit 10, support substrate 12 of the second circuit 11 is initially bonded to the base insulating layer 14 and supports the growing structure of SOI circuit 11 as it is built. However, with second circuit 11, support substrate 12 is temporarily bonded to base insulating layer 14 and is subsequently removed after layer 30 is provided over layers 22 and 24.

Once support substrate 12 is removed from the second circuit 11, base insulating layer 14 of circuit 11 is bonded with an adhesive to top insulating layer 36 of the first circuit 10 to form circuit 9 (FIG. 8). Layer 30 of circuit 11 is then etched to provide holes for conductive vias 82 and 86. Layers 30, 22, and 14 of circuit 11 and layer 36 of circuit 10 are progressively etched to provide holes for interconductive vias 81 and 85. Preferably, the layers in circuit 11 are selectively etched such that there is no physical contact between interlayer via 81 and layer 16 nor between interlayer via 85 and layer 24. The etched holes are then filled with conductive material to form vias 82 and 86 and interlayer vias 81 and 85.

Partial conductive layers 34 and 35 are deposited over layer 30. More specifically, layer 34 is deposited over interlayer via 81, over via 82, and partially over layer 30. Similarly, layer 35 is deposited over interlayer via 85 and partially over layer 30. Both partial layers 34 and 35 are subsequently etched to form appropriate connections for integrated circuit 11. Finally, the top insulating layer 36 for circuit 11 is provided over layers 34 and 35 and over any exposed surface of layer 30. Additional layers (not shown) similar to circuit 11 can be added to circuit 9. For example, an additional layer similar to layer 11 can be added above layers 34 and 35.

Precise alignment of integrated circuits 10 and 11 is necessary for proper operation of circuit 9. As wafer sizes become larger such as greater than 8 inches in diameter, alignment problems may become more difficult. However, the use of interlayer via 81 coupling to a conductive layer 34 instead of another via provides a larger area for making the connection between circuits 10 and 11 less difficult.

Direct via-to-via contact associated with vias 84 and 85 reduces the number of necessary layers such as layer 34 and saves area for circuit 10. Preferably, via 84 is tungsten, titanium, aluminum, or other refractory metal or liner which provides good etch selectivity with respect to layer 36. Similarly, conductive layer 34 is preferably a polycide, has a top side liner, or is a refractory metal which has good etch selectivity with respect to layer 36.

It is understood that, while the detailed drawings and specific examples describe the exemplary embodiments of the present invention, they are there for the purpose of illustration only. The apparatus and method of the invention is not limited to the precise details, geometries, dimensions, materials, and conditions disclosed. For example, although particular layers are described as being particular sizes, other sizes can be utilized. Further, although the example given refers to stacking two silicon-on-insulator (SOI) integrated circuits, more SO circuits can be stacked. Also, the present invention can be utilized with bulk-type semiconductor devices. Further still, although polysilicon is used as a gate conductor, other conductor materials can be utilized. Even further still, the drawings are not drawn to scale. Various changes can be made to the precise details discussed without departing from the spirit of the invention which is defined by the following claims.

What is claimed is:

1. An integrated circuit, comprising:

a first layer including a first semiconductor substrate containing a first channel region of at least one first field effect transistor, the first transistor including a gate conductor wherein the gate conductor surrounds all four sides of the first substrate, the first semiconductor substrate being disposed between a first insulating layer and a second insulating layer, the second insulating layer being coupled to a support substrate; and a second layer including a second semiconductor substrate containing a second channeled region of at least one second field effect transistor, the second semiconductor substrate being disposed between a third insulating layer and a fourth insulating layer, the fourth insulating layer being in contact with the first insulating layer, wherein the first semiconductor substrate is stacked below the second semiconductor substrate.

2. The integrated circuit of claim 1 wherein the first field effect transistor and the second field effect transistor are coupled by conductive via is provided through the first insulating layer and the fourth insulating layer.

3. The integrated circuit of claim 2 further comprising:

a metal layer disposed above the third insulating layer, the metal layer being coupled to the via.

4. The integrated circuit of claim 1 wherein the fourth insulating layer and the first insulating layer are bonded by an adhesive.

5. The integrated circuit of claim 1 wherein the first and second semiconductor substrates are bar-shaped.

6. A multilayer silicon-on-insulator structure for containing a plurality of transistors, the multilayer silicon-on-insulator structure comprising:

a first layer including a first semiconductor substrate containing a first channel region of at least one first field effect transistor, the first semiconductor substrate being at least partially surrounded by an insulative material and surrounded at least partially on four sides by a gate conductor; and a second layer including a second semiconductor substrate, the second semiconductor substrate being at least partially surrounded by an insulative material, wherein the first semiconductor substrate is stacked below the second semiconductor substrate, and the first layer is bonded to the second layer.

7. The multilayer silicon-on-insulator structure of claim 6 wherein a conductive via is disposed through the second layer into the first layer.

8. The multilayer silicon-on-insulator structure of claim 6 further comprising:

a metal layer disposed above the second layer, the metal layer being coupled to a plurality of vias, the vias extending to the first substrate through the second layer.

9. The multilayer silicon-on-insulator structure of claim 6 wherein the first layer and the second layer are bonded by an adhesive.

10. The multilayer silicon-on-insulator structure of claim 6 wherein the first and second semiconductor substrates are bar-shaped.

* * * * *